(12) United States Patent
Bauer et al.

(10) Patent No.: US 9,425,339 B2
(45) Date of Patent: Aug. 23, 2016

(54) THIN FILM SOLAR MODULE AND METHOD FOR PRODUCTION OF THE SAME

(71) Applicants: Michael Bauer, Leipzig (DE); Jochen Fritsche, Zoerbig (DE); Frank Becker, Leipzig (DE); Matthias Huchel, Calvoerde (DE)

(72) Inventors: Michael Bauer, Leipzig (DE); Jochen Fritsche, Zoerbig (DE); Frank Becker, Leipzig (DE); Matthias Huchel, Calvoerde (DE)

(73) Assignee: CALYXO GMBH, Bitterfeld-Wolfen (DE)

( * ) Notice: Subject to any disclaimer, the term of this patent is extended or adjusted under 35 U.S.C. 154(b) by 0 days.

(21) Appl. No.: 13/678,932

(22) Filed: Nov. 16, 2012

(65) Prior Publication Data

US 2013/0312808 A1 Nov. 28, 2013

Related U.S. Application Data

(63) Continuation of application No. PCT/EP2011/002660, filed on May 30, 2011.

(30) Foreign Application Priority Data

Jun. 2, 2010 (DE) .................... 10 2010 017 223

(51) Int. Cl.
| | |
|---|---|
| H02N 6/00 | (2006.01) |
| H01L 31/042 | (2014.01) |
| H01L 31/00 | (2006.01) |
| H01L 31/05 | (2014.01) |
| H01L 31/18 | (2006.01) |
| H01L 21/00 | (2006.01) |

(52) U.S. Cl.
CPC ........ *H01L 31/0508* (2013.01); *H01L 31/0504* (2013.01); *H01L 31/18* (2013.01); *Y02E 10/50* (2013.01)

(58) Field of Classification Search
CPC .. H01L 31/0504; H01L 31/0508; H01L 31/18
USPC ....................................... 136/244
See application file for complete search history.

(56) References Cited

U.S. PATENT DOCUMENTS

| | | | |
|---|---|---|---|
| 4,315,096 A | 2/1982 | Tyan | |
| 5,158,618 A * | 10/1992 | Rubin | ............. H01L 31/022425 136/244 |

(Continued)

FOREIGN PATENT DOCUMENTS

| | | |
|---|---|---|
| DE | 101 09 643 A1 | 9/2002 |
| DE | 101 09643 A1 | 9/2002 |

(Continued)

*Primary Examiner* — Luan Van
*Assistant Examiner* — Angelo Trivisonno
(74) *Attorney, Agent, or Firm* — Von Rohrscheidt Patents

(57) ABSTRACT

A thin film solar module including at least one first sub module including a plurality of first thin film solar cells connected with one another in series; and a second sub module connected with the first sub module in parallel, the second sub module including a plurality of second thin film solar cells connected with one another in series. The sub modules are formed on a shared substrate in a monolithic manner, wherein a first connecting cell including the first thin film solar cells and a second connecting cell including the second thin film solar cells are arranged adjacent to one another, spaced apart from each other through an insulation trench and electrically connected with one another through a shared contact. The invention further relates to a method for producing a thin film solar module.

15 Claims, 5 Drawing Sheets

(56) References Cited

U.S. PATENT DOCUMENTS

| | | |
|---|---|---|
| 5,593,901 A | 1/1997 | Oswald |
| 2002/0092558 A1 | 7/2002 | Kim |
| 2008/0142070 A1* | 6/2008 | Lechner ............ H01L 31/0201 136/244 |
| 2008/0216887 A1* | 9/2008 | Hacke ............... H01L 31/0516 136/244 |
| 2009/0084433 A1* | 4/2009 | Takeda ............... H01L 31/046 136/251 |
| 2009/0260671 A1* | 10/2009 | Green ............... H01L 31/0475 136/244 |
| 2010/0071752 A1* | 3/2010 | Vellore ............ H01L 31/02008 136/244 |

FOREIGN PATENT DOCUMENTS

| | | |
|---|---|---|
| DE | 102006057454 A1 | 6/2008 |
| EP | 2043154 | 4/2009 |
| JP | 61073386 | 4/1986 |
| JP | 07-297436 | 11/1995 |
| JP | 2003-152211 | 5/2003 |
| JP | 2004327901 | 11/2004 |
| WO | WO 03/050891 A2 | 6/2003 |

\* cited by examiner

PRIOR ART

1'  2'

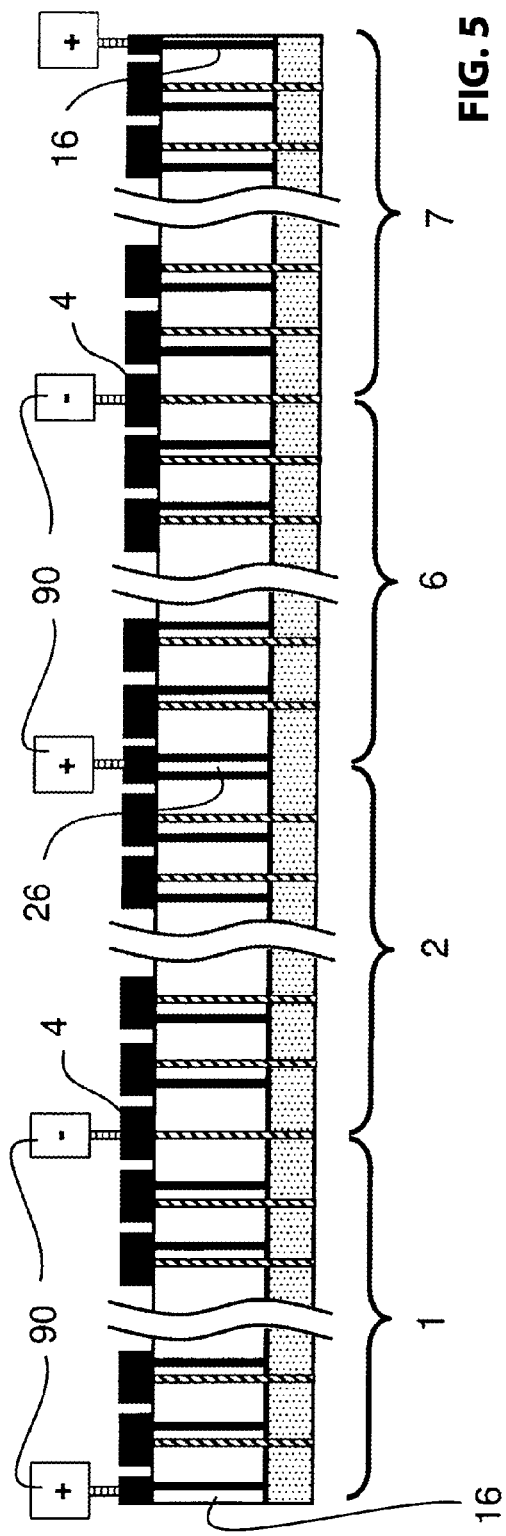
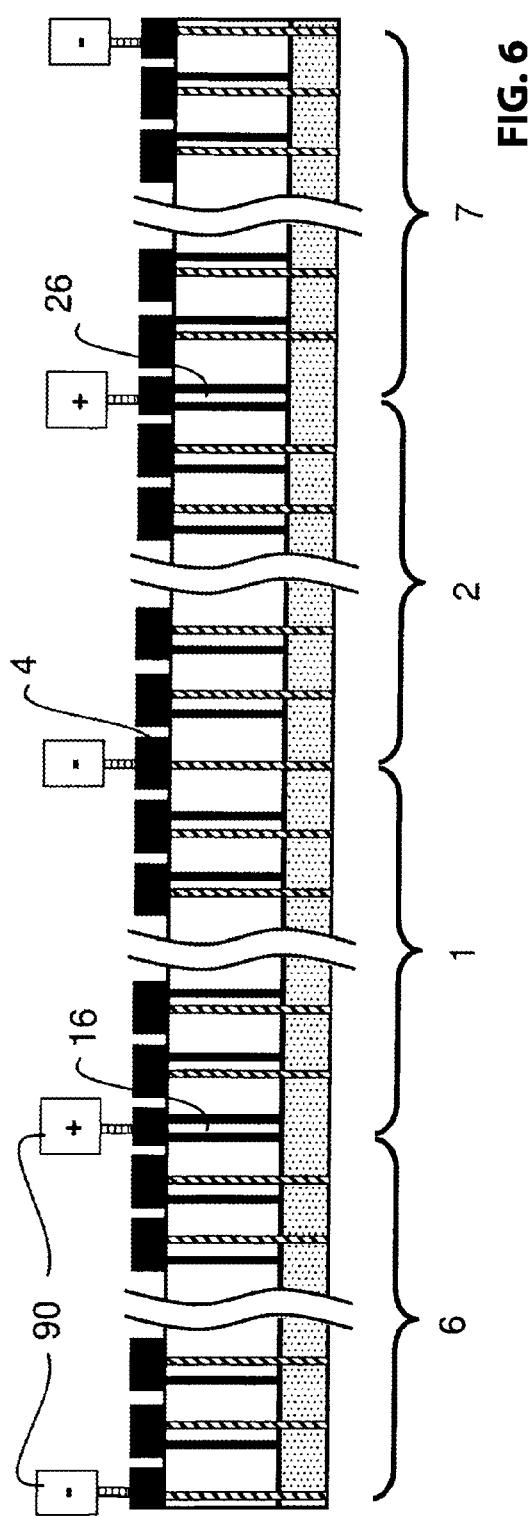

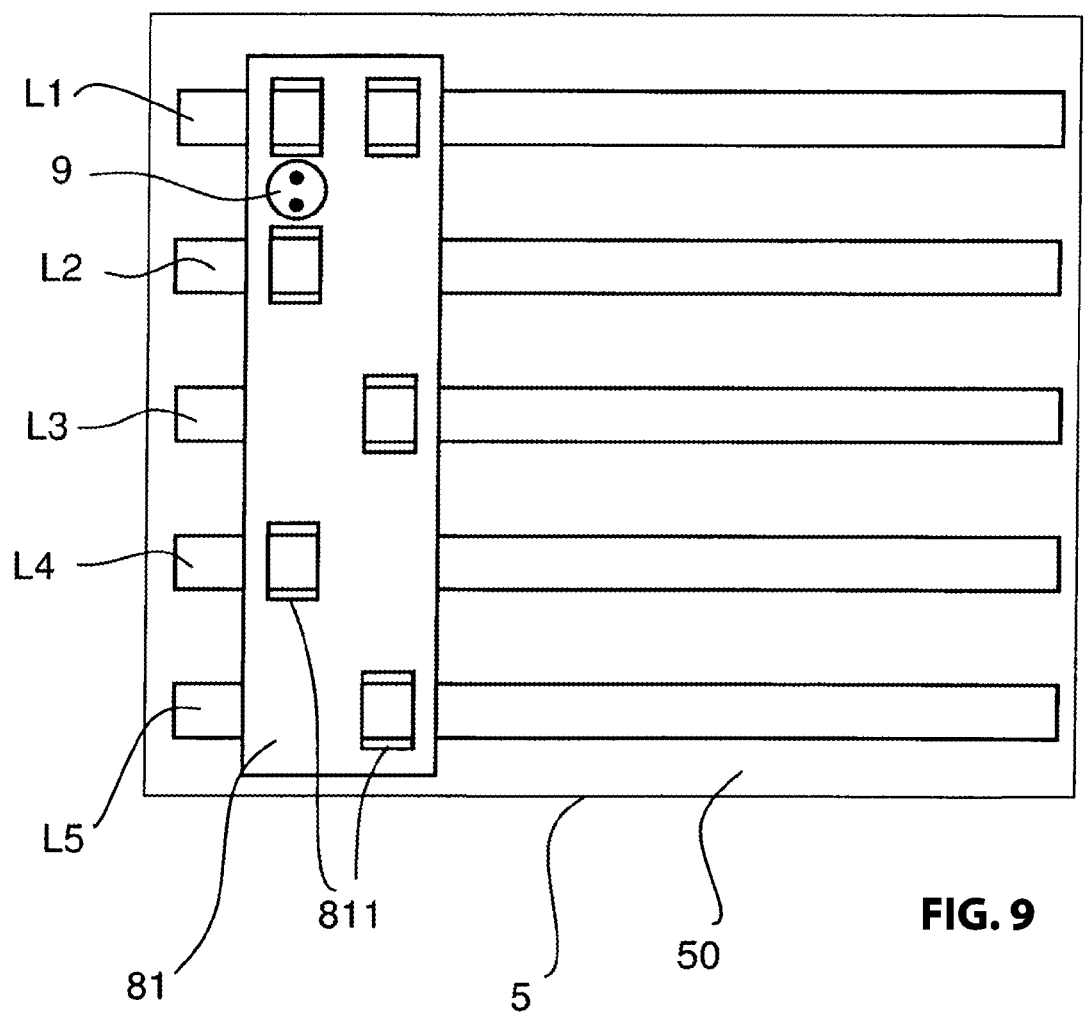

THIN FILM SOLAR MODULE AND METHOD FOR PRODUCTION OF THE SAME

RELATED APPLICATIONS

This application is a continuation of International Application PCT/EP2011/002660 filed May 30, 2011 claiming priority from German Patent Application DE 10 2010 017 223.5 on Jun. 2, 2010, both of which are incorporated in their entirety by this reference.

FIELD OF THE INVENTION

The invention relates to a thin film solar module and a production method for the thin film solar module.

BACKGROUND OF THE INVENTION

Thin film solar modules are typically made from a plurality of individual solar cells which are connected with one another in series. Therefore the total current of the module corresponds to the current from an individual solar cell, whereas the idle voltages of the solar cells essentially add to one another in the series connection. In order to obtain an output power that is as high as possible the solar cells have to be configured narrow since then losses based on low surface conductivities of the contact layers and series resistances are minimized. An embodiment for a thin film solar module of this type is disclosed in JP 2001-111083A. Therein particular sub-modules are described that are configured from solar cells that are connected with one another in series, wherein the sub-modules in turn are also connected with one another in series.

However, when a large number of solar cells are connected in series which is the case when the module is divided into many narrow solar cells, the module generates very high voltage and very low current. High voltages, however, are unsuitable for using thin film solar modules in photovoltaic systems and render these uneconomical. In a simple thin film solar module a compromise between a solar cell width and module voltage has to be made wherein typically the full power yield of the solar cells is not achieved.

In order to reduce the module voltage of the solar module identical sub modules made from solar cells that are connected in series are connected in parallel with one another. Thus, two collecting conductors or cell contact bands are required for each sub module, one respective cell contact band for contacting the first (positive) and the last (negative) in a series of solar cells connected in series. All positive and negative cell contact bands are then combined into a module exterior connector where the generated power is tapped from the outside.

U.S. 2009/0260671 describes a thin film solar module with plural sub modules which are connected in parallel with one another. Thus, the parallel connection is performed through a shared photovoltaically inactive solar cell. A photovoltaically inactive solar cell in each sub module, however, leads to lower overall light yield for the thin film solar module.

U.S. 2008/0142070 A1 follows a similar path. The thin film solar module described therein is also assembled from sub modules which are connected in parallel through shared solar cells at the sub module ends or sub modules edges. However, herein the number of inactive solar cells is reduced over U.S. 2009/0260671. The shared solar cells which are active, however, differ from the remaining solar cells. They therefore have to be adapted to the remaining solar cells in order to be connectable in series with the remaining solar cells which requires additional method steps. The solar cell module disclosed in JP2005-353767A also includes sub modules that are connected in parallel with one another through shared solar cells that differ from the remaining solar cells.

On the other hand side JP2000-049369A describes a thin film solar module assembled from plural sub modules in which the sub modules are connected with one another through solar edge cells in alternating polarization. The connection of the sub modules is thus provided through shared bus bars which reach into the layers of the thin film solar module to the front side electrode. This requires an additional method step for forming the bus bars. Additionally valuable solar module surface between the sub modules is wasted for the bus bars, wherein the surface is then not available any more for the active semiconductor layer.

Solar cell modules are known from DE 101 643 A1, JP 2004-327 901 A, JP 2003 152 211 A and JP 07 297 436 in which sub modules are separated from one another in a first step through breaking and the sub modules are then applied in a subsequent step to a shared substrate for producing the solar cell module.

A solar cell module is known from U.S. Pat. No. 4,315, 096 in which the sub modules are not separated from one another through breaking but are monolithically produced through a structuring process. U.S. Pat. No. 5,593,901A and JP 61 073 386 A also show monolithically configured thin film solar modules.

BRIEF SUMMARY OF THE INVENTION

Thus, it is an object of the invention to provide a thin film solar module and a method for its production so that the surface yield and the efficiency of the thin film solar module are increased in a cost effective manner.

An object of the invention is achieved through a thin film solar module including at least one first sub module including a plurality of first thin film solar cells connected with one another in series and at least one second sub module connected with the at least one first sub module in parallel, the at least one second sub module including a plurality of second thin film solar cells connected with one another in series. The at least one first sub module and the at least one second sub module are formed on a shared substrate in a monolithic manner. A first connecting cell including the plurality of the first thin film solar cells and a second connecting cell including the plurality of the second thin film solar cells are arranged adjacent to one another, spaced apart from each other through an insulation trench and electrically connected with one another through a shared contact. The insulation trench extends along a mirror plane with respect to which the at least one first sub module and the at least one second sub module are respectively arranged as mirror images of one another, and the first and the second thin film solar cells are strip shaped and the insulation trench essentially extends along an entire length of adjacent connecting cells.

Another object is of the invention is achieved through a production method for producing a thin film solar module including the steps of producing a thin film solar cell structure with a solar module surface and at least two sub modules that are monolithically arranged on a shared substrate and connected with one another in parallel, applying an insulation tape to the solar module surface, applying plural longitudinal collection conductors to the solar module surface, and applying at least two transversal collection conductors to the solar module surface transversal to an extension of the longitudinal collection conductors. The at least two sub modules are respectively formed from plural thin film solar cells connected with one another in series and configured strip shaped, so that a first connecting cell from the first thin film solar cells and a second connecting cell from the second thin film solar cells are arranged adjacent to one another, offset from one another through an insulation trench and electrically connected with one another through a shared contact. The insulation trench extends along a mirror surface with reference to which mirror surface the first sub module and the second sub module are configured essentially as mirror images of one another. The thin film solar cells are configured strip shaped and the insulation trench extends essentially along an entire length of the adjacent connecting cells. The insulation tape, the longitudinal collection conductors and the transversal collection conductors are applied so that the parallel connections of the sub modules are provided through the longitudinal collection conductors and the transversal collection conductors.

The object of the invention is achieved through a thin film solar module including at least one first sub module including a plurality of first thin film solar cells connected with one another in series; and a second sub module connected with the first sub module in parallel, the second sub module including a plurality of second thin film solar cells connected with one another in series, wherein the sub modules are formed on a shared substrate in a monolithic manner, wherein a first connecting cell including the first thin film solar cells and a second connecting cell including the second thin film solar cells are arranged adjacent to one another, spaced apart from each other through an insulation trench and electrically connected with one another through a shared contact, wherein the insulation trench extends along a mirror plane with respect to which the first sub module and the second sub module are respectively arranged as mirror images of one another, wherein the first and the second thin film solar cells are strip shaped and the insulation trench essentially extends along an entire length of the adjacent connecting cells.

The object is also achieved through a production method for producing a thin film solar module including the steps producing a thin film solar cell structure with a solar module surface and at least two sub modules that are monolithically arranged on a shared substrate and connected with one another in parallel, wherein the sub modules are respectively formed from plural thin film solar cells connected with one another in series and configured strip shaped, so that a first connecting cell from the first thin film solar cells and a second connecting cell from the second thin film solar cells are arranged adjacent to one another, offset from one another through an insulation trench and electrically connected with one another through a shared contact, wherein the insulation trench extends along a mirror surface with reference to which mirror surface the first sub module and the second sub module are configured essentially as mirror images of one another, wherein the thin film solar cells are configured strip shaped and the insulation trench extends essentially along an entire length of the adjacent connecting cells; applying an insulation tape to the solar module surface; applying plural longitudinal collection conductors to the solar module surface; and applying at least two transversal collection conductors to the solar module surface transversal to an extension of the longitudinal collection conductors, wherein applying the insulation tape, the longitudinal collection conductors and the transversal collection conductors is provided so that the parallel connection of the sub modules is provided through the longitudinal collection conductors and the transversal collection conductors.

The invention is based on the feature that the parallel connection of the two adjacent sub modules is not performed through a solar cell that is shared between the sub modules, but through connecting cells that are respectively arranged at the edge of a respective sub module. Thus, it is appreciated that the connecting cells advantageously do not substantially differ from the remaining solar cells in the sub modules.

While the shared contact provides a contact connection between the first and the second connecting cell, the connecting cells are otherwise offset from one another and insulated through the insulation trench. The shared contact which contacts the two connecting cells is advantageously part of a back side contact layer; however it may also be part of a front side contact layer. Since the shared contact is part of a contact layer that is used anyhow for producing the thin film solar cell, forming the shared contact is feasible without additional method steps.

When producing the thin film solar module it is advantageous to initially apply a front side contact layer, semiconductor layer and a back side contact layer to a substrate in sequence, namely through deposition. The substrate and the front side contact layer thus have to be sufficiently transparent in order to pass light incising during use of the solar module. Thus, window glass can be used as a substrate and a transparent conductive oxide can be used as front side contact layer. The layers are structured during or after application so that they form a series of solar cells that are connected in series which are then connected in parallel group by group namely joined into sub modules. At least two of the sub modules are thus electrically connected with one another through connection solar cells recited supra through a shared contact.

In order to separate the two connecting cells through the insulation trench the insulation trench advantageously extends over a semiconductor layer thickness of a semiconductor layer. In an advantageous embodiment it is provided that the insulation trench extends essentially completely over a semiconductor layer thickness of a semiconductor layer and furthermore over a contact layer thickness of a front side contact layer. This can be achieved in that after applying the front side contact layer and the semiconductor layer the two layers are structured simultaneously in that insulation trenches through the two layers are generated. Thus, the insulation layers reach the substrate.

In an advantageous embodiment it is provided that the insulation trench is partially or completely filled with an insulation material. On the one hand side selecting a suitable insulating material can improve the insulating properties of the insulating trench. Furthermore for example a complete filling of the insulating trench prevents penetration of additional deposited material when depositing additional layers after forming the insulation trench, in particular when depositing a back side contact layer. A plastic material or a lacquer can be used as an insulation material.

According to an advantageous embodiment it is provided that the first connecting cell and/or the second connecting cell are photovoltaically active. Avoiding photovoltaically inactive solar cells in the thin layer solar module increases its efficiency.

It is advantageously provided that the insulation trench extends along a mirror surface with respect to which the first sub module and the second sub module are essentially arranged as mirror images of one another. The mirror image configuration of the two sub modules with respect to the mirror surface has the effect that the sub modules are polarized in opposite directions relative to one another. The feature of opposite polarization can also be achieved without strictly mirror image configuration and has the effect that the currents generated in the partial portions flow in opposite directions to one another, thus either to the mirror surface or away from the mirror surface.

In an advantageous embodiment additional sub modules are provided, wherein the additional sub modules are polarized in an alternating manner in a transversal manner extending parallel to a solar module surface. Thus it is advantageous that at least two sub modules are connected in parallel with one another through a photovoltaically inactive bridge solar cell. Thus, the bridge solar cell can have become photovoltaically inactive in that its semiconductor layer is shorted on both sides through contact trenches filled with conductive material.

Consequently an embodiment can be configured in particular so that sub modules that are adjacent to one another in transversal direction are connected with one another in pairs in an alternating manner through two active connecting cells and an inactive bridge cell.

According to an advantageous embodiment it is provided that the solar cells are stripe shaped and the insulation trench essentially extends along an entire length of the adjacent connecting cells. In this embodiment the transversal direction recited supra would extend essentially perpendicular to the longitudinal direction along which the direction the strip shaped solar cells extend.

In order to make sub modules accessible from the outside that are connected in parallel with one another longitudinal collecting conductors and transversal collecting conductors are arranged on the solar module surface which collecting conductors are eventually connected with a module exterior connection. Put differently the sub modules made from series connected strip shaped solar cells can be connected with one another through collecting conductors and can then be connected with the exterior module connection in order to tap the electrical power at this location which is generated in the thin film solar module through conversion of incident light. For this purpose longitudinal collecting conductors are provided that advantageously extend along an extension of the strip shaped solar cell, wherein one longitudinal collecting conductor is arranged on the shared contact and electrically connected with the shared contact. Furthermore two transversal collecting conductors are provided that extend transversal to the longitudinal collecting conductors and contact the longitudinal collecting conductors.

While the subsequently described connection of the thin film solar module through the longitudinal collecting conductor and the transversal collecting conductor is adapted in a particular manner for the thin film solar modules described herein through connecting cells connected through a shared contact, the described connection can also be advantageously used for thin film solar modules that are structured differently in order to be able to efficiently tap the electrical power generated therein.

Contact points between the longitudinal collection conductors and the transversal collection conductors can thus be formed through solder joints, welds, for example ultrasonic bonds (or US bonds) glue joints or similar. This also applies for contact points between the longitudinal collection conductors or transversal collection conductors and the back side contact layer of the solar cells. The contact points are arranged at the intersection points between longitudinal collection conductors and transversal collection conductors.

According to a preferred embodiment it is provided that insulation strips are arranged between the longitudinal collection conductors and the transversal collection conductors so that the parallel connection of the sub modules is provided through the longitudinal collection conductors and the transversal collection conductors. Through the insulating strips an electrical contact between the longitudinal collection conductors and the transversal collection conductors at intersection points is prevented where contact points are not provided.

It is advantageously provided that at least one insulating tape is arranged between the transversal collection conductors and a back side contact layer of the thin film solar module. The insulation tape is thus used for electrically separating the transversal collection conductor relative to the solar cells and/or relative to the longitudinal conductors at locations where a contact is not desired. When a single insulation tape is used it should at least have a width which corresponds to a double width of the transversal collection conductors or exceeds this width so that both transversal collection conductors can be placed thereon simultaneously. However, also two or more insulation tapes can be used.

The insulation tape and/or insulation strip can be cut from flat insulating material. Advantageously the insulation tape and/or the insulation strips include adhesives on one side or on both sides for simple handling. In the embodiments in which one or plural insulation tapes and also insulation strips are provided both insulation means can be made from the same material.

In a useful embodiment it is provided that the longitudinal collection conductors are arranged along the transversal direction in an alternating manner on a shared contact and on a contact of a bridge solar cell and are electrically connected therewith. Put differently, each second longitudinal conductor is applied to a shared contact. In order to facilitate parallel connection of the sub modules the longitudinal collection conductors arranged on the shared contacts are electrically connected with one of the transversal collection conductors and the longitudinal collection conductors arranged on the contacts of the bridge solar cells are electrically connected with the other transversal collection conductor. A connection that differs from this, however, is possible in that one of the transversal collection conductors or both transversal collection conductors are cut after application to the thin film solar module.

For the connection of the thin film solar module through the collection conductor one insulating tape, plural longitudinal collection conductor and at least two transversal collection conductors are applied to the solar module surface one after another, wherein the sequence of application of these elements depends from the respective embodiment. In any case the transversal collection conductors are applied to the solar module surface transversal to an extension of the longitudinal collection conductors, wherein applying the insulating tape, the longitudinal collection conductors and the transversal collection conductors is provided so that a parallel connection of the sub module is provided through the longitudinal collection conductors and the transversal collection conductors.

According to an advantageous embodiment the insulation tape is applied after applying the longitudinal collection conductors and before applying the transversal collection conductors to the solar module surface, wherein openings in the insulating tape for contacting the longitudinal collection conductors with the transversal collection conductors are provided before, during or after applying the insulation tape. Thus, the sequence in this case reads as follows: first the longitudinal collection conductors, then the insulating tape or the insulating tapes and eventually the transversal collection conductors. In this embodiment no additional insulating strips are required, since the electrical insulating of the transversal collection conductors relative to the longitudinal collection conductors is already achieved through the insulation tape.

In an alternative embodiment of the production method it is provided that the longitudinal collection conductors are applied to the insulation tape, wherein insulation strips are applied at intersection points between the longitudinal collection conductors and the transversal collection conductors after applying the longitudinal collection conductors and before applying the transversal collection conductors. Thus, the application sequence based on the solar module surface reads as follows: First the insulation tape or plural insulation tapes then the longitudinal collection conductors, then the insulation strips and eventually the transversal collection conductors.

According to another variation of the production method it is provided that the longitudinal collection conductors are applied to the insulation tape, wherein insulation strips are arranged at intersection points between the longitudinal collection conductors and the transversal collection conductors before applying the longitudinal collection conductors and after applying the transversal collection conductors. In this case the sequence is as follows: first the insulation tape or plural insulation tapes then the transversal collection conductors, then the insulation strips and eventually the longitudinal collection conductors. Compared to the preceding embodiment the sequence of applying the transversal collection conductors and longitudinal collection conductors is switched.

In an advantageous embodiment one of the transversal collection conductors is electrically connected with both poles of a module outside connection, wherein the transversal collection conductor is cut before or after connecting with the poles of the module exterior connection in order to electrically insulate both poles from one another. This has a significant advantage in that no additional collection conductors for contacting the longitudinal collection conductors are required besides the two recited transversal connection conductors.

BRIEF DESCRIPTION OF THE DRAWINGS

The invention is subsequently described based on embodiments with reference to drawing figures, wherein:

FIG. 5 illustrates a transversal sectional view of a thin film solar module with four sub modules;

FIG. 6 illustrates a cross sectional view of a thin film solar module with four sub modules according to an embodiment that is an alternative to FIG. 5;

FIG. 9 illustrates a depiction of a thin film solar module provided with longitudinal collection conductors in top view with an alternative insulation tape before applying transversal collection conductors.

DETAILED DESCRIPTION OF THE INVENTION

Figure 1:
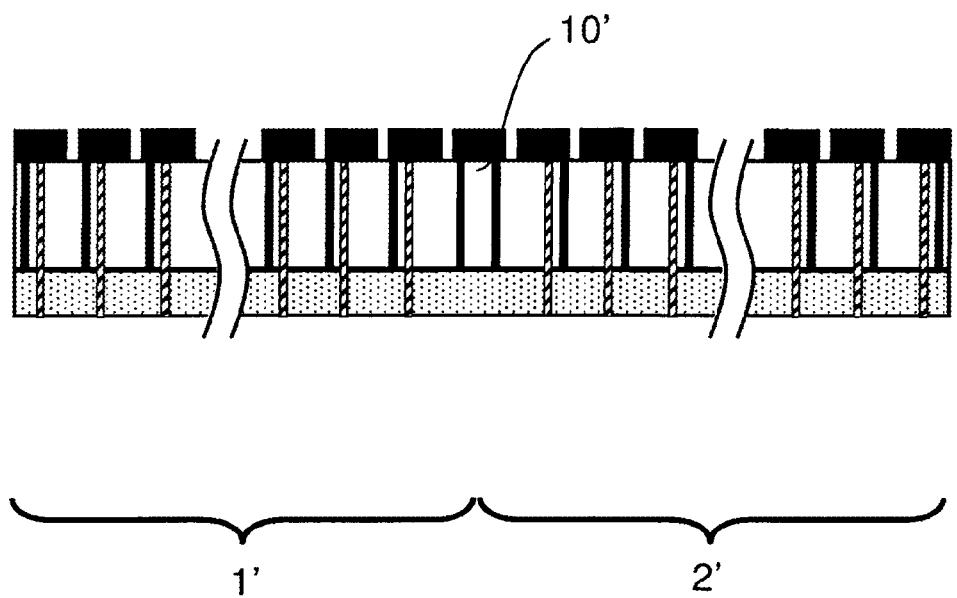
FIG. 1 illustrates a schematic transversal sectional view of a known solar module.
Figure 2:
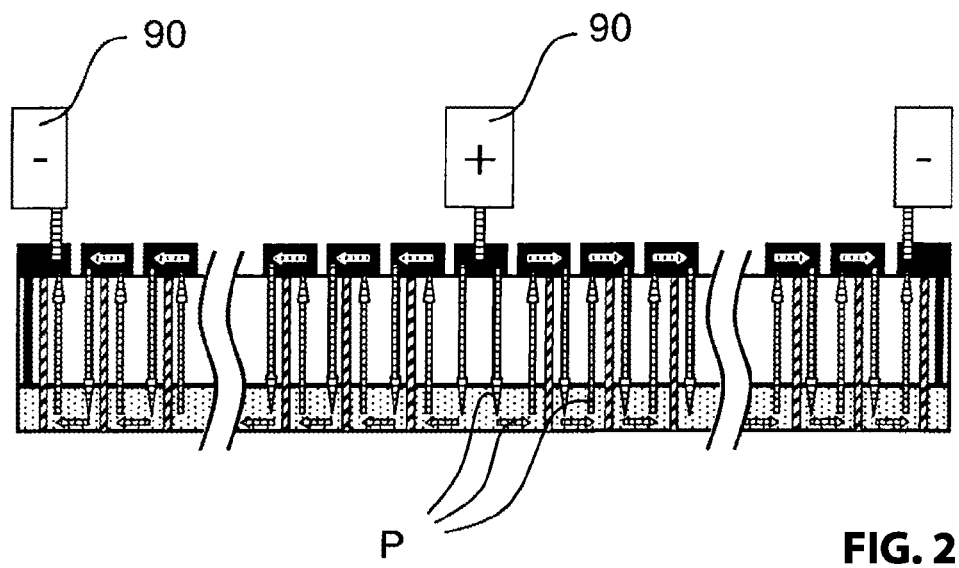
FIG. 2 schematically illustrates current paths in the solar module of FIG. 1.

With reference to FIGS. 1 and 2 known solar modules from U.S. 2009/0260671 are subsequently described. FIG. 1 schematically illustrates a cross sectional view of a known solar module with strip shaped solar cells, wherein the sectional plane extends transversal to a longitudinal direction of the solar cells cell strips. The solar module includes two sub modules 1', 2' which are connected with one another through a shared photovoltaically inactive solar cell 10'.

A current flow within the known solar module is illustrated in FIG. 2 based on current flow arrows P. For this purpose the solar module is schematically illustrated as being electrically contacted through tapping contacts 90, wherein the solar cell 10' which is shared between both sub modules 1', 2' is connected at a positive tapping contact 90. Since the shared solar cell 10' is photovoltaically inactive the current flows during operation of the solar module from the positive tapping contact 90 through two conductive portions adjacent to the shared solar cell 10' into the two sub modules 1', 2'. Based on the symmetrical configuration of the sub modules and based on the shared solar cell 10' also the current flow illustrated in FIG. 2 is symmetrical.

Figure 3:
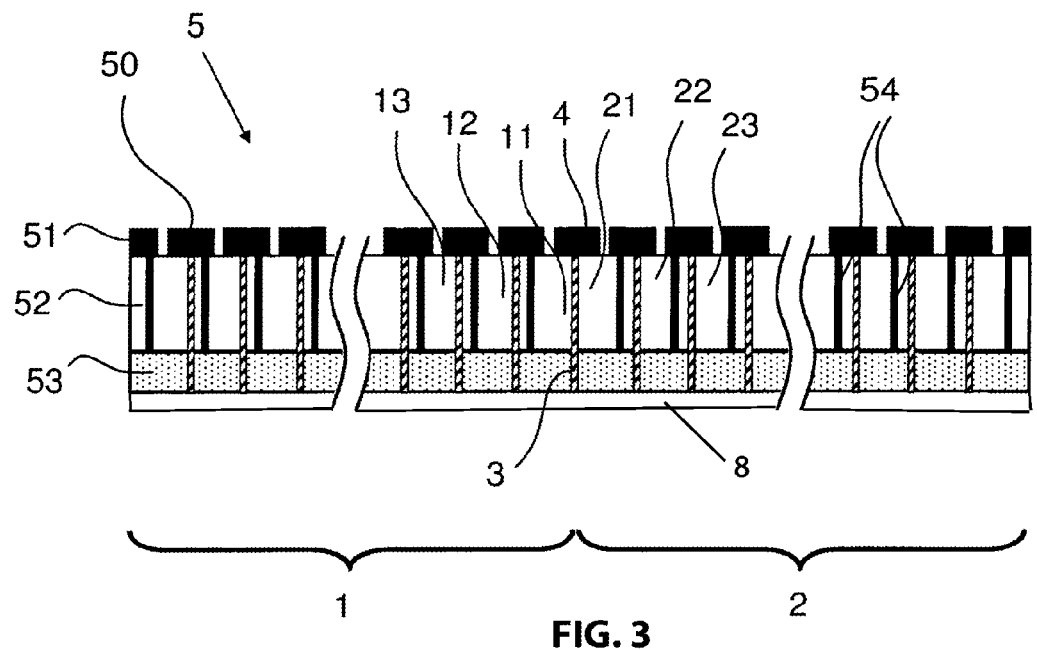
FIG. 3 schematically illustrates a schematic sectional view of a thin film solar module with two sub modules connected through two shared cells.

FIG. 3 illustrates a monolithically produced thin film solar module 5 with a back side contact layer 51, a semi conductor the layer 52 arranged thereunder and a front side contact layer 53 arranged thereunder. A substrate 8 on which the first layer sequence 51, 52, 53 is arranged is illustrated in FIG. 3 and not illustrated in the subsequent figures, however it is arranged preferably as a base on a side of the front side contact layer 53 that is oriented away from the semi conductor layer 52. The substrate is made from window glass, while the front side contact layer 53 arranged thereon is made from a transparent conductive material, for example a transparent conductive oxide (TCO—transparent conductive oxide), and thus also light permeable. The backside contact layer 51 forms a solar module surface 50 on which the electrical current that is generated in the semi conductor layer 52 is tapped through collection conductors, so-called bus bars.

Due to a structuring of the recited layers (51, 52, 53) a first sub module 1 is formed that includes plural first solar cells 11, 12, 13 connected with one another in series and a second sub module 2 including plural second solar cells 21, 22, 23 connected with one another in series. Advantageously additional sub modules are provided, wherein FIG. 3 only illustrates a partial view of the thin film solar module 5. The individual solar cells 11, 12, 13, 21, 22, 23 extending in a direction perpendicular to the viewing surface of FIG. 3 and having a strip shape are separated from one another through insulation trenches 3. The insulation trenches 3 extend through the semiconductor layer 52 and the front side contact layer 53 to the substrate.

On the other hand side the contact trenches 54 only extend through the semiconductor layer 52 and connect the front side contact layer 53 with the backside contact layer 51 in order to form the series connection of the solar cells 11, 12, 13, 21, 22, 23 with one another. The contact trenches 54 are additionally filled with electrically conductive material, for example with the material of the backside contact layer 51 which also penetrates into the contact trenches 54 when applying the backside contact layer 51. In order to prevent such penetration of the conductive material into the insulation trenches 3, the insulation trenches 3 are advantageously completely filled with insulation material.

The two sub modules 1, 2 in FIG. 3 are arranged adjacent to one another and connected with one another through a shared contact 4, wherein the shared contact 4 forms a shared backside contact of a first connecting cell 11 of the first sub module 1 and of a second connecting cell 21 of the second sub module 2. The shared contact 4 is furthermore part of the backside contact layer 51 and generated when structuring the latter. In the embodiment illustrated in FIG. 3 and FIG. 4 the solar cells 11, 1213, 21, 22, 23 of the sub modules 1, 2 are arranged in a mirror symmetrical manner about the insulation trench 3 arranged below the shared contact 4.

Figure 4:
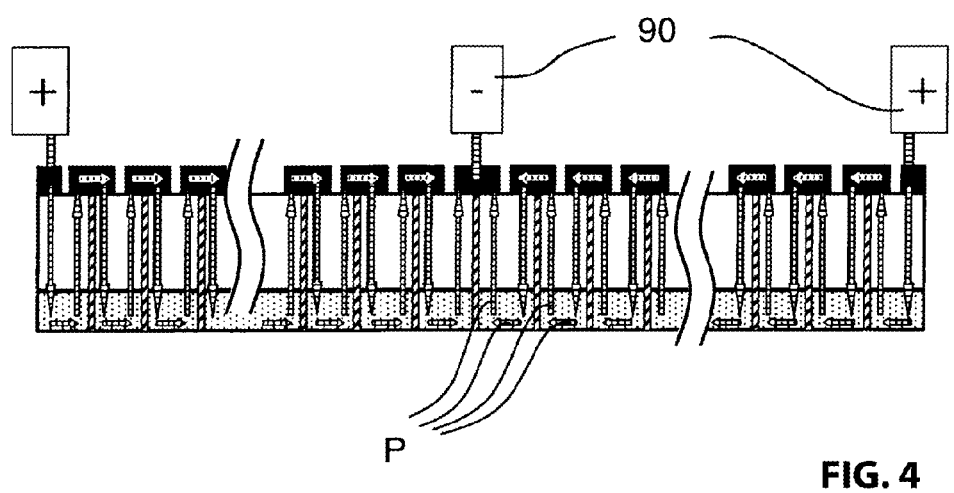
FIG. 4 schematically illustrates the current paths in the solar module in FIG. 3.

FIG. 4 illustrates the same sectional view as fix three, wherein superimposed current flow arrows P are illustrated in FIG. 4 which represent the current flow within the thin film solar module 5 during operations. Due to the doting of the semiconductor layer 52 the shared contact 4 is polarized in a negative manner in the illustrated instant case. This is illustrated based on schematically drawn tapping contacts 90 which are polarized as a function of the current flow direction in the thin film solar module 5.

The fact that the two connections cells 11, 21 are photovoltaically active is already evident from the fact that the current flow between the shared contact 4 and the front side contact layer 53 goes through the connections cells 11, 21 and not like for the inactive solar cell 10' of FIG. 2 through contact trenches which are adjacent the inactive solar cell 10'. As apparent in FIG. 4 based on the current path the sub modules 1, 2 are polarized opposite to one another. This is a consequence from the mirror image configuration of the thin film solar module 5 with respect to a mirror surface which extends through the insulation trench offsetting the two sub modules 1, 2. This mirror image configuration can be advantageous, but it is not necessary to achieve an opposite polarization of the two sub modules 1, 2.

FIGS. 5 and 6 respectively illustrate a thin film solar module 5 with two additional sub modules 6, 7 in addition to the first and the second sub modules 1, 2. Also the additional sub modules 6, 7 are formed from solar cells that are connected in series. The sub modules 1, 2, 6, 7 are connected with one another in parallel, wherein the collection conductors required for this purpose are not illustrated in FIGS. 5 and 6 for simplicity reasons, but are only illustrated in the subsequent figures.

In FIG. 5 one of the additional sub modules 6 is connected through a photovoltaically inactive bridge solar cell 26 with the second sub module 2. The photovoltaically inactive bridge solar cell 26 can thus be configured like the photovoltaically inactive solar cell 10' that is known in the art and was described supra in the in the introduction. Since the two additional sub module 6, 7 are connected in turn through additional connections cells through a shared contact 4, the thin film solar module five according to FIG. 5 includes two photovoltaically active contact portions, namely those which are connected with the negative tapping contacts 90 illustrated herein. Since also the two most exterior solar cells in the illustrated thin film solar module 5 are additional inactive bridge solar cells 16, a total of 3 inactive contact portions is provided in this embodiment, namely those that are connected with the positive tapping contacts 90 illustrated herein.

On the other hand side the sub modules 1, 2, 6, 7 in the thin film solar module 5 according to the embodiment illustrated in FIG. 6 are wired differently. Herein the photovoltaically inactive bridge solar cells 16, 26 are respectively arranged between the first sub module 1 and another sub module 6 and between the second sub module 2 and another sub module 7. Due to this alternative embodiment the thin film solar module 5 includes three active contact portions and only two inactive contact portions. Thus the embodiment according to FIG. 6 is a thin film solar module 5 that is optimized relative to the embodiment according to FIG. 5 and includes four sub modules.

Figure 7:
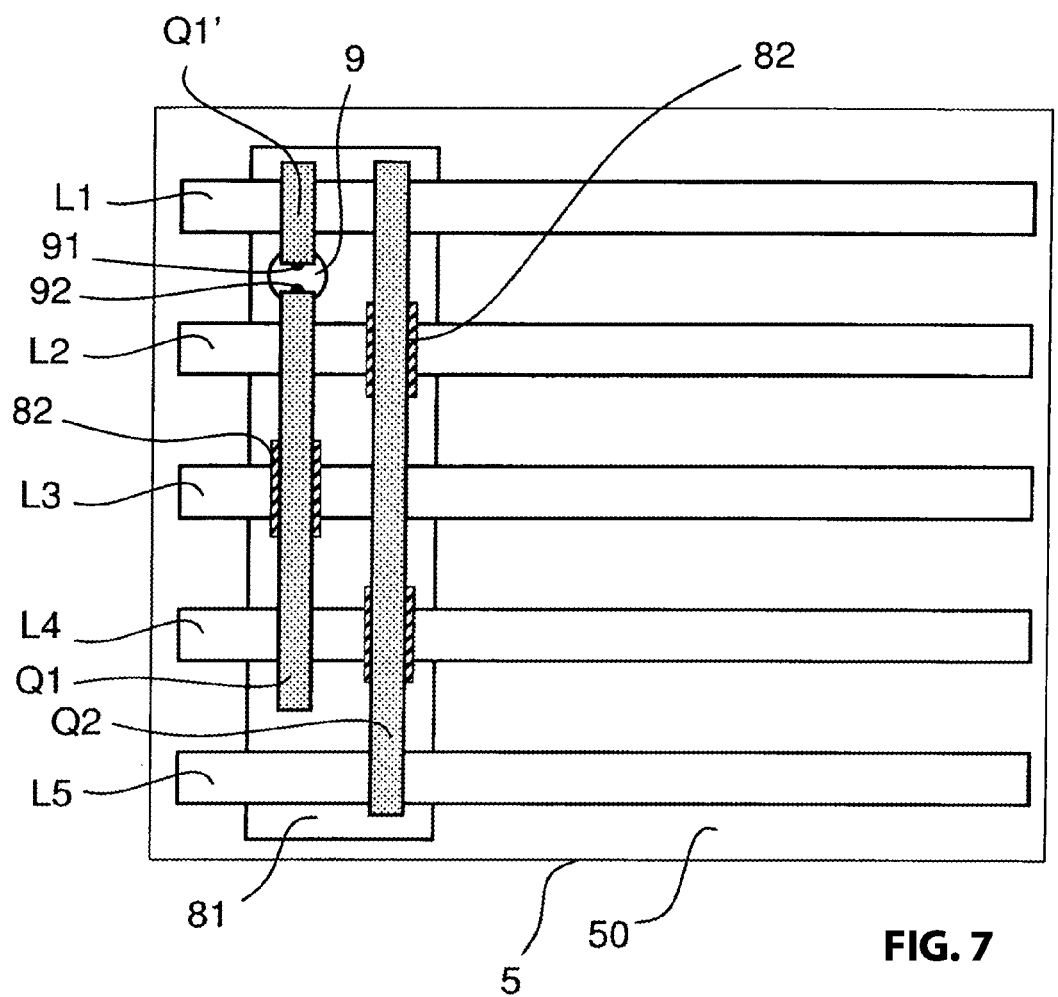
FIG. 7 illustrates a schematic view of a thin film solar module connected through collection conductors in top view.

FIG. 7 schematically illustrates a top view of a thin film solar module 5 which is connected through longitudinal collection conductors L1, . . . , L5 and transversal collection conductors Q1, Q2. For this purpose initially on insulation tape 81 is arranged on the solar module surface 50 in order to prevent an undesired shortage of the solar cells due to the transversal collection conductors Q1, Q2. Subsequently the longitudinal collection conductors L1, . . . L5 were applied onto the solar module surface 50 so that they contact the shared contacts 4 and/or the contacts of the inactive bridge solar cells 16, 26. Sections all of the longitudinal collection conductors L1, . . . L5 that are not contacting the insulation tape 81 contact the contacts of the solar cells 11, 12 arranged thereunder advantageously with their full surface or at least in sections.

The longitudinal collection conductors L1, . . . L5 are electrically connected through the transversal collection conductors Q1, Q2 so that the sub modules (1, 2, 5, 6) not explicitly illustrated in FIG. 7 form a parallel connection. Furthermore the sub modules 1, 2, 6, 7 are connected through transversal collection conductors Q1, Q2 with the poles 91, 92 of a module external connection 9 for tapping the electrical energy that is generated in the thin film solar module 5. While one of the transversal collection conductors Q2 is connected with three longitudinal collection conductors L1, L3, L5, insulation strips 82 at intersection points between this transversal collection conductor Q2 and two additional longitudinal collection conductors L2, L4 prevent an electrical contact between these conductors.

The two additional longitudinal collection conductors L2, L4 are connected instead with the other transversal collection conductor Q1 which is connected with another pole 92 of the module outer connection 9. One of the longitudinal collection conductors L1 is in turn connected through a collection conductor section Q1' with the other pole 91 of the module outer connection 9. The collection conductor section Q1' advantageously is a section of the transversal collection conduct the Q1 which is separated after being arranged on and connected with the longitudinal collection conductors L1, L2, L4 in a portion between the poles 91, 92 of the module outer connection nine.

Figure 8:
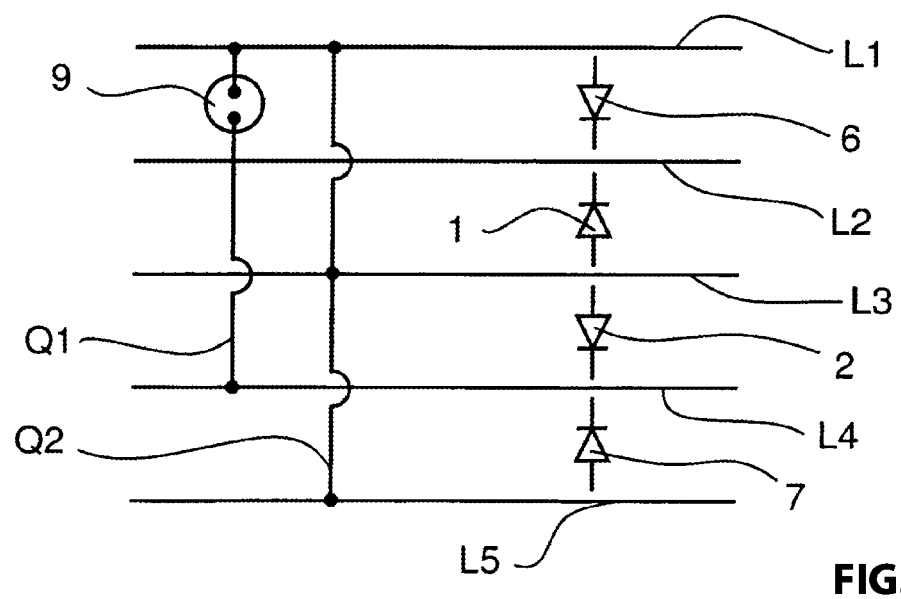
FIG. 8 illustrates a wiring diagram for describing the connection of the thin film solar module according to FIG. 8.

The connection of the thin film solar module 5 according to FIG. 7 is described in FIG. 8 based on a wiring diagram. The wiring diagram is a surrogate wiring diagram for the thin film solar module 5 in which the sub modules 1, 2, 6, 7 are represented in the form of diodes which are connected with one another through the longitudinal collection conductors L1, . . . L5 and the transversal collection conductors Q1, Q2 and with the module external connection 9. Herein it is clearly visible that the sub modules 1, 2, 6, 7 are polarized in an alternating manner along the transversal direction.

Eventually FIG. 9 illustrates an alternative option to achieve the same connection of the sub modules 1, 2, 6, 7 as described based on FIGS. 7 and 8 through a specially prepared insulation tape 81 without using additional insulation strips 82. FIG. 9 thus illustrates the longitudinal collection conductors L1, . . . L5 which are directly applied to the solar module surface 50, thus as illustrated in FIG. 7, but without prior application of the insulating tape 81. Subsequently an insulating tape 81 is placed over the longitudinal collection conductors L1, . . . L5, wherein the insulating tape includes opening 811 at predefined contact points between the longitudinal collection conductors L1, . . . , L5 and the transversal collection conductors Q1, Q2. Alternatively the openings 811 can also be formed after applying the insulating tape 81.

The transversal collection conductors Q1, 02 which are subsequently arranged on the insulating tape 81 and contacted through the openings 811 with the longitudinal collection conductors L1, . . . L5, are not drawn in FIG. 9 for reasons of clarity. Like in the embodiment according to FIG. 7, also in the embodiment according to FIG. 9 the insulating tape 81 can include two or more sections which are respectively only arranged below one of the longitudinal collection conductors Q1, Q2.

REFERENCE NUMERALS AND DESIGNATIONS

1', 2' sub modules
10' photovoltaically inactive solar cell
1 first sub module
11, 12, 13, first solar cells
11 first connecting cell
2 second sub module
21, 22, 23 second solar cells
21 second connecting cell
3 insulation trench
4 shared contact
5 thin film solar module
50 solar module surface
51 backside contact layer
52 semiconductor layer
53 front side contact layer
54 contact trenches
6, 7 additional sub modules
8 substrate
16, 26 inactive bridge solar cells
81 insulating tape
811 openings
82 insulating strips
9 external module connection
91, 92 poles of the external module connection
90 tapping contacts
L1, L2, L3, L4, L5 longitudinal collection conductors
Q1, Q2 transversal collection conductor
Q1' collection conductor section
P Current flow arrows

What is claimed is:
1. A thin film solar module, comprising:
at least one first sub module including a plurality of first thin film solar cells connected with one another in series; and
at least one second sub module connected with the at least one first sub module in parallel, the second sub module including a plurality of second thin film solar cells connected with one another in series,
wherein a voltage produced by the plurality of first thin film solar cells has a polarity opposite of a voltage produced by the plurality of second thin film solar cells,
wherein the at least one first sub module and the at least one second sub module are jointly formed on a shared substrate in a monolithic manner through deposition,
wherein a first connecting cell including the first thin film solar cells and a second connecting cell including the second thin film solar cells are arranged adjacent to one another, spaced apart from each other through an insulation trench and electrically connected with one another through a shared contact,
wherein the shared contact is directly contacting on a semiconductor layer of the first connecting cell and a semiconductor layer of the second connecting cell,
wherein the semiconductor layer of the first connecting cell is directly contacting the insulation trench,
wherein the semiconductor layer of the second connecting cell is directly contacting the insulation trench,
wherein the first connecting cell and the second connecting cell are photovoltaically active,
wherein the insulation trench is between the first sub module and the second sub module,
wherein the first and the second thin film solar cells are strip shaped and the insulation trench essentially extends along an entire length of the first and second connecting cells,
wherein no semiconductor material is positioned between the first connecting cell and the second connecting cell,
wherein a front side contact layer of the first sub module and a front side contact layer of the second sub module directly contact the shared substrate,
wherein a back side contact layer of the first sub module is connected with the semiconductor layer of the first connecting cell and a back side contact layer of the second sub module is connected the semiconductor layer of the second connecting cell,
wherein the semiconductor layer of the first connecting cell is between the back side contact layer of the first sub module and the front side contact layer of the first module,
wherein the semiconductor layer of the second connecting cell is between the back side contact layer of the second sub module and the front side contact layer of the second module,
wherein the back side contact layer of the first sub module, the back side contact layer of the second sub module, and the shared contact are formed from a common layer,
wherein the shared substrate is a single piece of material having only one portion, and,
wherein each sub module is separated by an insulation trench that extends completely through the front side contact layer.

2. The thin film solar module according to claim 1, wherein the insulation trench extends over a semiconductor layer thickness of a semiconductor layer and over a contact layer thickness of a front side contact layer.

3. The thin film solar module according to claim 1, wherein the insulation trench is partially or completely filled with an insulation material.

4. The thin film solar module according to claim 1, further comprising additional sub modules formed on the substrate, wherein the sub modules are polarized in an alternating sequence.

5. The thin film solar module according to claim 4, wherein at least two sub modules are connected with one another in parallel through a photovoltaically inactive bridge solar cell.

6. The thin film solar module according to claim 4, wherein the at least one second sub module and at least one of the additional sub modules are connected with one another in parallel through a photovoltaically inactive bridge solar cell.

7. The thin film solar module according to claim 1,
wherein longitudinal collection conductors extend along an extension of the plurality of the first thin film solar cells and the plurality of the second thin film solar cells,
wherein one of the longitudinal collection conductors is arranged on the shared contact and electrically connected therewith, and
wherein two transversal collection conductors extend transversal to the longitudinal collection conductors and contact the longitudinal collection conductors.

8. The thin film solar module according to claim 7,
wherein insulation strips are arranged between the longitudinal collection conductors and the transversal collection conductors, and
wherein the parallel connection of the at least one first sub module, the at least one second sub module and the at least one additional sub module is provided through the longitudinal collection conductors and the transversal collection conductors.

9. The thin film solar module according to claim 7, wherein at least one insulation tape is arranged between the transversal collection conductors and a backside contact layer of the thin film solar module.

10. The thin film solar module according to claim 7,
wherein at least two sub modules are connected with one another in parallel through a photovoltaically inactive bridge solar cell, and
wherein the longitudinal collection conductors are arranged in transversal direction in an alternating manner on the shared contact and on a contact of the photovoltaically inactive bridge solar cell and are electrically connected therewith.

11. The thin film solar module according to claim 1, the thin film solar module further comprising:
a thin film solar cell structure with a solar module surface and the at least two sub modules that are monolithically arranged on the shared substrate and connected with one another in parallel,
wherein the at least two sub modules are respectively formed from plural thin film solar cells connected with one another in series and configured strip shaped, so that a first connecting cell from the first thin film solar cells and a second connecting cell from the second thin film solar cells are arranged adjacent to one another, offset from one another through an insulation trench and electrically connected with one another through a shared contact,
wherein the insulation trench extends along a mirror plane with reference to which mirror plane the first sub module and the second sub module are configured essentially as mirror images of one another,
wherein the thin film solar cells are configured strip shaped and the insulation trench extends essentially along an entire length of the adjacent connecting cells;
an insulation tape applied to the solar module surface;
a plurality of longitudinal collection conductors on the solar module surface; and
at least two transversal collection conductors on the solar module surface transversal to an extension of the longitudinal collection conductors,
wherein the insulation tape, the longitudinal collection conductors and the transversal collection conductors are arranged so that the parallel connections of the sub modules are provided through the longitudinal collection conductors and the transversal collection conductors.

12. The thin film solar module according to claim 11, wherein the insulation tape is arranged on the solar module surface and on the longitudinal collection conductors and under the transversal collection conductors, and
wherein the insulation tape has openings for contacting the longitudinal collection conductors with the transversal collection conductors.

13. The thin film solar module according to claim 11,
wherein the longitudinal collection conductors are arranged on the insulation tape, and
wherein insulation strips are arranged at intersection points between the longitudinal collection conductors and the transversal collection conductors on the longitudinal collection conductors and under the transversal collection conductors.

14. The thin film solar module according to claim 11,
wherein the longitudinal collection conductors are arranged on the insulation tape, and
wherein the insulation strips are arranged at intersection points between the longitudinal collection conductors and the transversal collection conductors under the longitudinal collection conductors and on the transversal collection conductors.

15. The thin film solar module according to claim 11,
wherein one of the transversal collection conductors is electrically connected with both poles of an external module connection, and
wherein the transversal collection conductor is cut in-between connection with the poles of the external module connection in order to electrically insulate the two poles from one another.

* * * * *